(12) United States Patent
Hu et al.

(10) Patent No.: US 8,619,832 B2
(45) Date of Patent: Dec. 31, 2013

(54) LENS COUPLED QUANTUM CASCADE LASER

(75) Inventors: Qing Hu, Wellesley, MA (US); Alan Wei Min Lee, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 365 days.

(21) Appl. No.: 12/437,818

(22) Filed: May 8, 2009

(65) Prior Publication Data
US 2010/0002739 A1 Jan. 7, 2010

Related U.S. Application Data

(60) Provisional application No. 61/051,582, filed on May 8, 2008.

(51) Int. Cl.
*H01S 5/00* (2006.01)

(52) U.S. Cl.
USPC .............. 372/50.23; 372/45.01; 372/101; 372/108

(58) Field of Classification Search
USPC .............. 372/45.01, 50.23, 101, 108
See application file for complete search history.

(56) References Cited

U.S. PATENT DOCUMENTS

| | | |
|---|---|---|
| 7,158,545 B2 | 1/2007 | Hu et al. |
| 2003/0219052 A1 | 11/2003 | Goodhue et al. |
| 2005/0058166 A1 | 3/2005 | Hu et al. |
| 2007/0019702 A1* | 1/2007 | Day et al. ............ 372/101 |
| 2008/0144677 A1* | 6/2008 | Belkin et al. ........... 372/20 |

FOREIGN PATENT DOCUMENTS

| | | | |
|---|---|---|---|
| EP | 562754 A1 * | 9/1993 | ............ H01S 3/025 |
| EP | 1317786 B1 | 6/2003 | |
| EP | 1500176 B1 | 1/2005 | |

OTHER PUBLICATIONS

Danylov et al. "Transformation of the multimode terahertz quantum cascade laser beam into Gaussian, using hollow dielectric waveguide," Applied Optics, vol. 46, No. 22, Aug. 2007, 5051-5055.*
Kohler, et al., "Terahertz semiconductor-heterostructure laser," Nature 417, 156-159 (2002).
Williams, et al., "3A-THz quantum cascade laser based on longitudinal-optical-phonon scattering for depopulation," App. Phys. Lett. 82, 1015-1017 (2003).
Williams, et al., "High-power terahertz quantum-cascade lasers," Elec. Lett. 42, 89-90 (2006).
Belkin, et al., "Terahertz quantum cascade lasers with copper metal-metal waveguides operating up to 178K," Opt. Express 16, 3242-3248 (2008).
Amanti, et al., "Horn antennas for terahertz quantum cascade lasers," Elec. Lett., vol. 43, 573-574 (May 2007).
Barbieri, et al., "Integrated Horn Antenna for Microstrip Waveguide THz Quantum Cascade Lasers," CLEO 2007.

(Continued)

*Primary Examiner* — Yuanda Zhang
(74) *Attorney, Agent, or Firm* — Thomas J. Engellenner; Reza Mollaaghababa; Pepper Hamilton LLP

(57) ABSTRACT

Terahertz quantum cascade (QC) devices are disclosed that can operate, e.g., in a range of about 1 THz to about 10 THz. In some embodiments, QC lasers are disclosed in which an optical element (e.g., a lens) is coupled to an output facet of the laser's active region to enhance coupling of the lasing radiation from the active region to an external environment. In other embodiments, terahertz amplifier and tunable terahertz QC lasers are disclosed.

26 Claims, 14 Drawing Sheets

(56) References Cited

OTHER PUBLICATIONS

Lee, et al., "High-power and high-temperature THz quantum-cascade lasers based on lens-coupled metal-metal waveguides," Opt. Lett. 32, 2840-2842 (2007).

Kohen, et al., "Electromagnetic modeling of terahertz quantum cascade laser waveguides and resonators," J. App. Phys., 97, 053106 (2005).

Hensley, et al., "Demonstration of external cavity terahertz quantum cascade laser," Opt. Terahertz Science and Technology Meeting, Orlando, FL (Mar. 2005).

Xu, et al., "Tunable terahertz quantum cascade lasers with an external cavity," Appl. Phys. Lett., 91, pp. 121104 (2007).

Belkin, et al., "Terahertz quantum-cascade laser source based on intracavity difference-frequency generation," Nature Photonics, 1, pp. 288 (May 2007).

Fitzgerald, et al., "Nondestructive Analysis of Tablet Coating Thicknesses Using Terahertz Pulsed Imaging," J. Pharm. Sci., 9, pp. 177-183.

Yasui, et al., "Terahertz Paintmeter for noncontact monitoring of thickness and drying progess in paint films," App. Opt., 44, pp. 6849.

Kumar, et al., "Surface-emitting distributed feedback terahertz quantum-cascade lasers in metal-metal waveguides," Optics Express, vol. 15, No. 1 (2007).

International Search Report and Written Opinion for PCT/US2009/043297 dated Feb. 23, 2010.

* cited by examiner

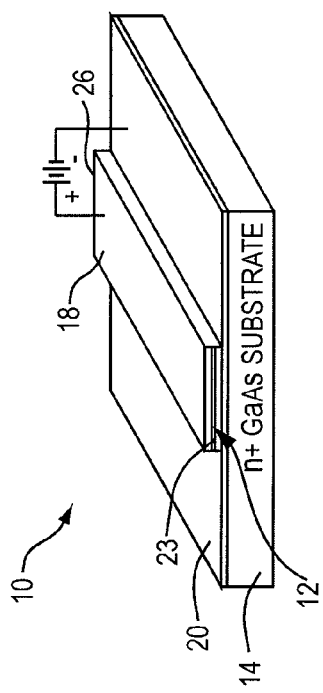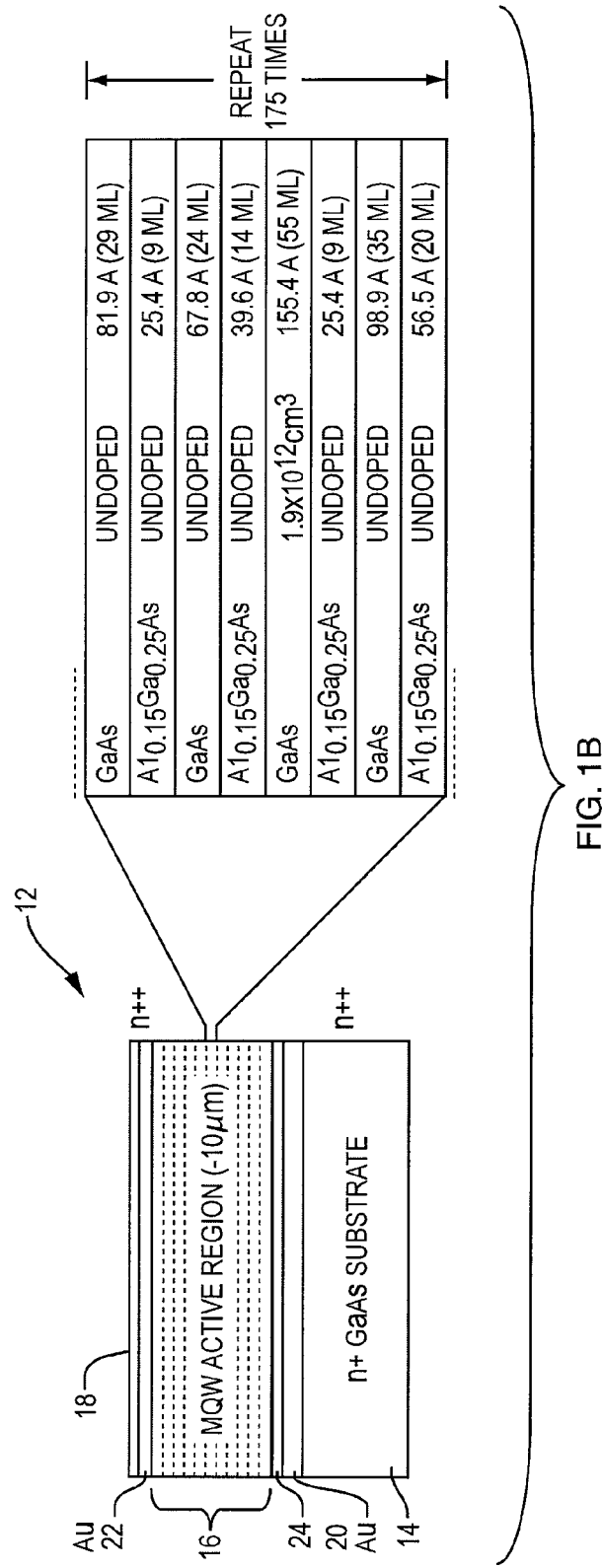

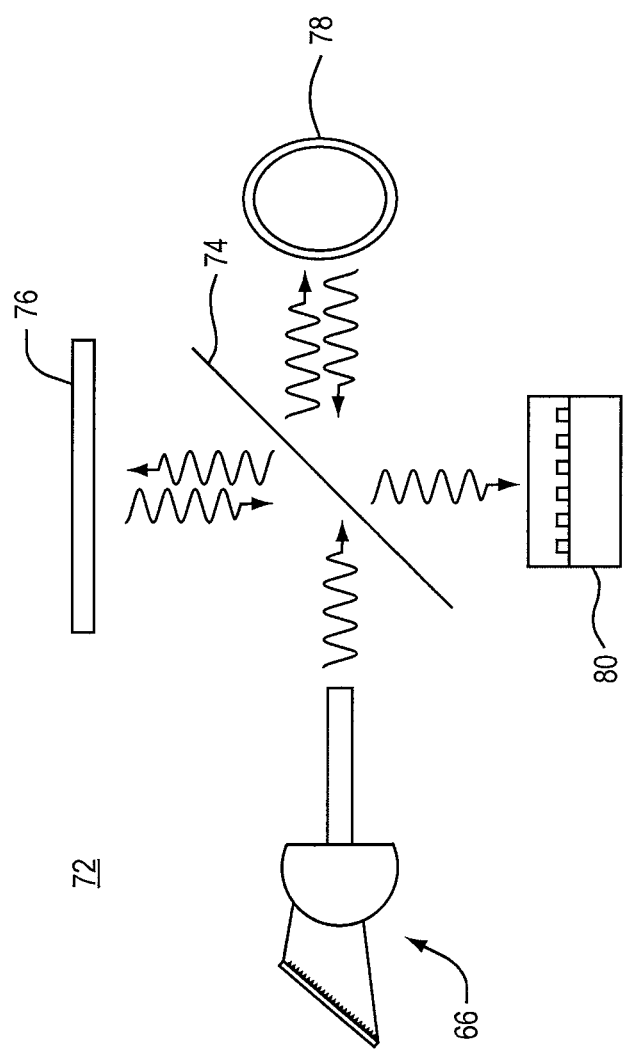

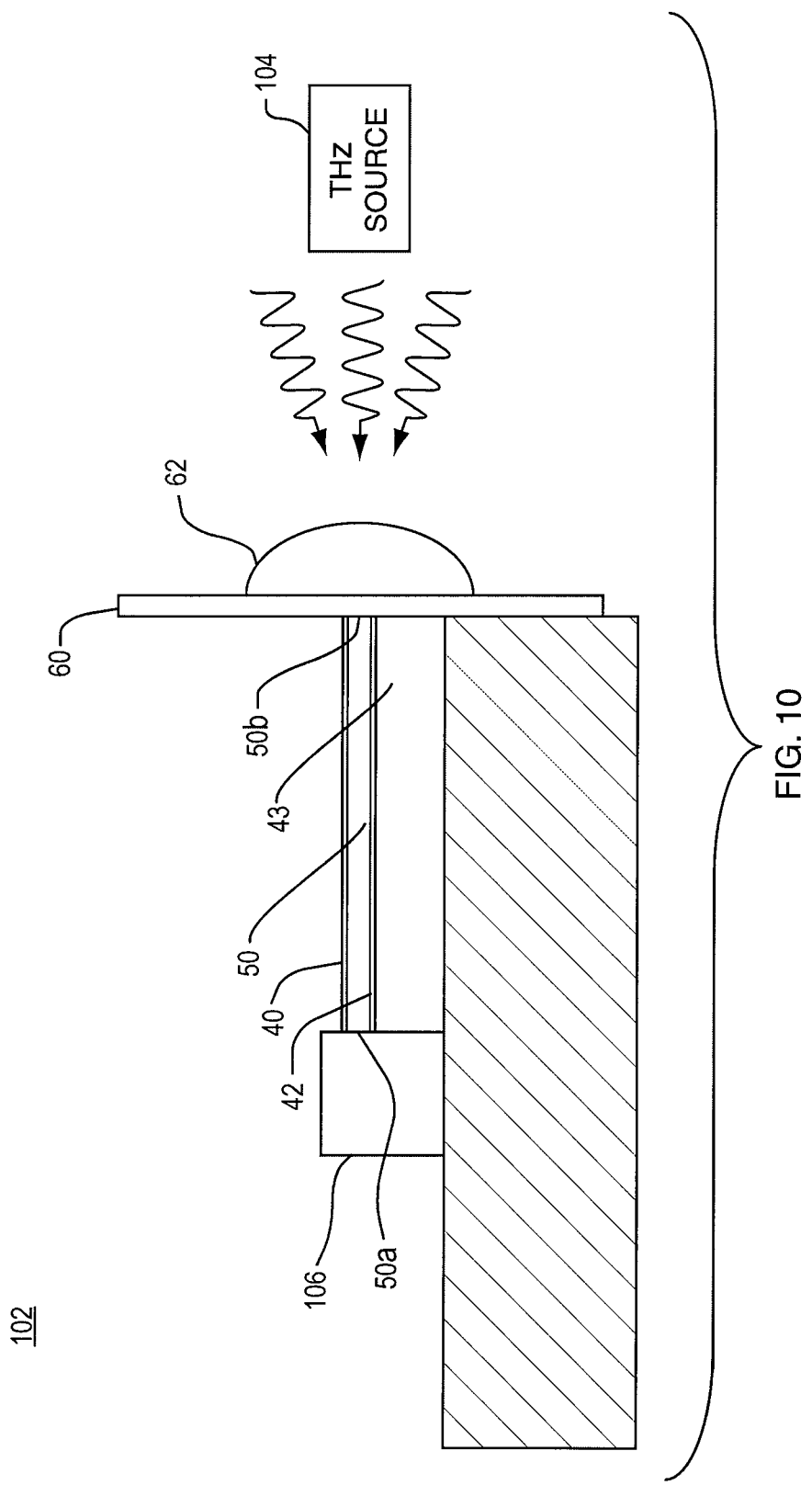

LENS COUPLED QUANTUM CASCADE LASER

RELATED APPLICATION

The present application claims priority to a provisional application entitled "Lens coupled quantum cascade laser" filed on May 8, 2008 and having a Ser. No. 61/051,582, which is herein incorporated by reference.

FEDERALLY SPONSORED RESEARCH

This invention was made with Government support under grant NNX07A199G by NASA, grant FA9550-06-1-0462 by AFOSR, and grant ECS0500925 by NSF. The Government has certain rights in the invention.

BACKGROUND

The present invention relates generally to quantum cascade (QC) lasers and amplifiers, and more particularly to such lasers and amplifiers that operate in the terahertz region of the electromagnetic spectrum.

Quantum cascade lasers operating at terahertz frequencies (1-10 THz, or 30-300 μm in wavelength) are promising sources of radiation in this underutilized portion of the electromagnetic spectrum. For example, terahertz QC lasers are desirable sources for imaging and spectroscopic applications because they are high-powered, and can operate in continuous wave, and can operate over a range of frequencies, e.g., between 1.2 and 4.9 THz. Terahertz QC lasers are not, however, yet portable as they require, e.g., cryogenic cooling for operation.

The use of the metal-metal waveguide structure in terahertz QC lasers has lowered the cooling requirements, e.g., allowing operating temperatures of about 178 K. The tradeoff for this higher temperature operation is lower power levels (10's of milliwatts) and highly divergent emission patterns (>180 degrees). Recently, several research groups have investigated various structures to mitigate these drawbacks. These techniques, however, suffer from a number of shortcomings. For example, they can involve microfabrication of horn antennas within the waveguide, which can be cumbersome. For example, the horn dimensions must be flared to control the beam in order to control divergence, which necessitates three dimensional fabrication techniques.

Accordingly, there is a need for enhanced terahertz QC lasers.

SUMMARY

Quantum cascade (QC) devices, such as quantum cascade lasers and amplifiers, are disclosed having an active region, a waveguide and an optical element coupled to an output facet to reduce reflectivity of that facet to radiation generated within the active region, e.g., to improve performance. In some embodiments, a lens, with or without a spacer, can be coupled to a QC laser having a metal-metal waveguide while in other embodiments the lens can be coupled to a QC laser having a semi-insulating waveguide.

In one aspect, the invention provides a terahertz QC laser in which an optical element (e.g., a lens) is optically coupled to a metal-metal waveguide of the laser (e.g., to the output facet of the laser's active region) so as to improve the laser's output coupling and beam forming characteristics. For example, the optical element can have an index of refraction similar to that of the laser's active region (gain medium) so as to provide index matching between the active region and the lens. For example, in some cases, the difference between the index of refraction of the optical element and that of the active region is less than about 50%. In some cases, the use of the optical element can result in a reduction of the maximum operating temperature (e.g., maximum temperature of the active region at which lasing radiation can be generated). This reduction can be modest. For example, the use of the optical element can result in a reduction of the maximum operating temperature of the laser by a value less than about 10 degrees C., or by a value less than about 5 degrees C. Anti-reflection coatings can be used on the lens to provide index matching from the lens to the external environment. Further, the use of a lens can improve beam formation, e.g., by narrowing the divergence of the beam. By way of example, this can in turn result in more usable power for terahertz imaging with less stringent requirement on cryogenic cooling.

By way of example, in some implementations, a quantum cascade laser is disclosed that includes an active region for generating lasing radiation in a frequency range of about 1 terahertz (THz) to about 10 THz, where the active region has an output facet through which the radiation can be coupled to an external environment. The laser further includes a waveguide formed of an upper metallic layer and a lower metallic layer, where each layer is disposed on a surface of the active region so as to confine one or more modes of the lasing radiation within the active region. An optical element is coupled to the output facet so as to enhance coupling of the radiation from the active region to the external environment.

In a related aspect, in the above QC laser, the optical element has an index of refraction that is intermediate that of the active region and that of the external environment so as to provide index matching between the active region and the external environment.

In some cases, the optical element can include a spacer, e.g., in the form of slab, and a lens. The spacer can be optically coupled at one surface thereof, e.g., via contact, with the output facet of the active region and can be in contact at an opposed surface with the lens. The combination of the spacer and the lens can enhance the output power of the lasing radiation while reducing its divergence. By way of example, the lens can be a hemispherical lens. In some cases, rather than utilizing both the spacer and the lens, only the spacer or only the lens can be employed.

The optical element (e.g., the spacer and the lens) can be formed of a variety of materials. For example, in some cases, the optical element is formed of high resistivity silicon, e.g., silicon exhibiting a resistivity greater than about 10 KΩ cm or a semi-insulating gallium arsenide (e.g., semi-insulating gallium arsenide exhibiting a similar high resistivity). In many cases, the spacer and the lens are formed of the same material to reduce, and preferably eliminate, reflections of the radiation at their interface due to refractive index mismatch.

In some embodiments, the active region of the above QC laser can comprise a heterostructure providing a plurality of lasing modules connected in series. Each lasing module can comprise a plurality of quantum well structures collectively generating at least an upper lasing state, a lower lasing state, and a relaxation state such that the upper and the lower lasing states are separated by an energy corresponding to an optical frequency in a range of about 1 THz to about 10 THz. The electrons populating the lower lasing state exhibit a non-radiative relaxation via resonant emission of LO-phonons into the relaxation state. In some cases in which a double-metal waveguide can be employed, a contact layer is disposed between each metallic layer of the waveguide and a surface of the heterostructure forming the active region. The contact layers can be formed of a heavily doped semiconductor, e.g., GaAs having a doping level of about $10^{18}$ cm$^{-3}$. Further, the metallic layers can be formed of a single metal (e.g., gold) or can alternatively have a multi-layer structure.

In other aspects, the use of lens-coupling in a terahertz QC laser having a semi-insulating surface plasmon waveguide is disclosed, which can allow for use of optical element(s) external to the laser cavity for providing tunable external cavity lasers (e.g., continuously tunable over a frequency range) or optical amplifiers, as discussed in more detail below.

When coupled to a semi-insulating waveguide of a QC laser, the lens can suppress the lasing action by reducing the reflectivity of the facet to which it is coupled. This allows a reflective optical element (e.g., a mirror) disposed external to the active region of the device to provide the requisite optical feedback for lasing. In some cases, a frequency selective reflective element (e.g., a reflection grating) can then be used to tune the lasing frequency, resulting in a frequency tunable laser. In another application, the suppression of lasing can be employed to allow the gain medium to be used in a semiconductor optical amplifier, which can be useful, e.g., as a preamplifier stage in a sensitive receiver.

In some embodiments, a quantum cascade laser is disclosed that includes an active region for generating lasing radiation in a frequency range of about 1 THz to about 10 THz, where the active region includes a first facet through which radiation is coupled to an external environment as well as a second opposed facet. The laser further includes a waveguide formed of at least one semi-insulating surface plasmon layer for providing mode confinement in the active region. In some cases, the waveguide can be formed of a metallic layer and a semi-insulating surface plasmon layer. Alternatively, the waveguide can be formed of two semi-insulating surface plasmon layers. An optical element (e.g., a lens) coupled to the second facet of the active region enhances transmission (leakage) of radiation through that facet, thereby increasing the effective loss of the laser cavity (combination of the active region and the waveguide). In some cases, the optical element can quench the lasing action. The laser further includes a reflective element disposed external to the active region to provide optical feedback to cause lasing in the active region. In other words, the feedback provided by the reflective element can overcome the loss caused by the optical element coupled to active region to sustain lasing action within the active region for one or more frequencies.

In a related aspect, the reflective element can include a mirror, e.g., formed of a metal exhibiting high electrical conductivity such as aluminum or gold. In some cases, the reflective element can provide frequency selective reflection to initiate lasing at one or more radiation frequencies but not others. For example, the frequency selective reflective element can include a reflective grating (e.g., formed of aluminum or gold Echelle grating for high reflectivity in Littrow configuration). A mechanism coupled to the grating can be employed to adjust the grating angle relative to the incident radiation so as to tune the frequency of the lasing radiation generated by the active region. In some cases, a collimating element (e.g., an off-axis parabolic mirror) disposed external to the laser cavity can be used to collimate the radiation emerging from the active region (e.g., through the combination of the spacer and the lens) and to direct the collimated radiation to the grating. The frequency selected radiation returning from the grating is then reimaged onto the output facet of the active region by the collimator.

In another aspect, a quantum cascade amplifier is disclosed that includes an active region adapted to amplify radiation in a frequency range of about 1 THz to about 10 THz. The active region includes an input facet for receiving radiation and an output facet through which amplified radiation can be coupled out of the active region. The amplifier further includes a waveguide formed of at least one semi-insulating surface plasmon layer for providing mode confinement in the active region. An optical element (e.g., a lens) is coupled to the input facet to enhance transmission of the terahertz radiation through that facet. Further, a detector is coupled to the output facet (e.g., placed in proximity of the output facet or abutted against it) to detect amplified radiation leaving the active region through the output facet. In some implementations an amplification greater than about 5 fold (5× amplification) can be expected.

In another aspect, an optical coherence tomography imaging system is disclosed that includes at least one tunable terahertz quantum cascade laser adapted to generate radiation with a central frequency in a range of about 1 THz to about 10 THz, where the laser is tunable over a frequency bandwidth about the central frequency (e.g., over a frequency bandwidth in a range of about 150 GHz to about 500 GHz). The system further includes an interferometer in optical coupling with the tunable laser to receive radiation therefrom. The interferometer is adapted to couple a portion of the received radiation to a reference arm and another portion of the received radiation to a sample arm for illuminating a sample. The interferometer provides an output beam comprising combined radiation reflected from the reference arm and the sample arm. A detector (e.g., a microbolometer array) in optical coupling with the interferometer detects the output beam. The detector can detect the output radiation beam while the laser is tuned over a frequency range so as to provide an interferogram. An analysis module in communication with the detector can analyze the interferogram (e.g., by obtaining a Fourier transform of the interferogram) to derive information about the sample. The information can comprise, e.g., the reflectivity of the sample to terahertz radiation as a function of depth. Further, the interferometer can be adapted to include a variety of other optical elements, e.g., such as those in a Linnick interferometer. These optical elements can include, e.g., a variety of low loss spherical lenses or cylindrical lenses that are adapted for operation at terahertz frequencies (e.g. formed of anti-reflection coated high-resistivity silicon).

The terahertz lasers according to the teachings of the invention can operate in a pulsed mode or a continuous-wave (CW) mode.

Further understanding of the invention can be obtained by reference to the following detailed description in conjunction with the associated drawings, which are described briefly below.

BRIEF DESCRIPTION OF THE DRAWINGS

FIG. 1A schematically depicts a conventional terahertz quantum cascade laser,

FIG. 1B is a cross-sectional view of the laser of FIG. 1A illustrating a heterostructure forming the laser's active region, FIG. 2A schematically shows salient features of a terahertz quantum cascade laser according to an embodiment of the invention.

DETAILED DESCRIPTION

Figure 2A:
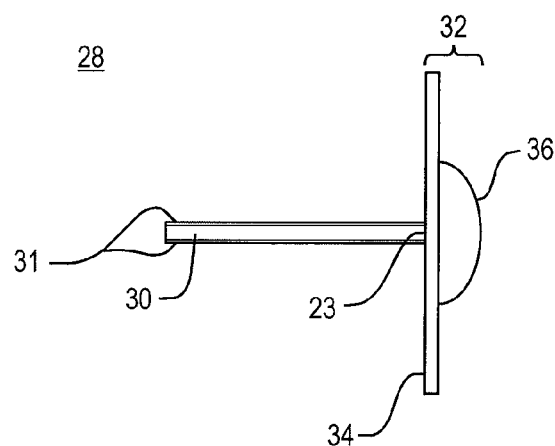
FIG. 2B shows another schematic view of the quantum cascade laser of FIG. 2A including a high-resistivity spacer abutted against an output facet of the laser's active region as well as a hyperhemispherical lens coupled to the spacer.
FIG. 2C shows schematically the lens of FIG. 2B with an anti-reflection coating disposed on a surface thereof.

In the following discussion, various aspects of the invention are discussed in connection with QC lasers and particular types of waveguides (metal-metal and semi-insulating plasmon waveguides). Various teachings of the invention can, however, be more generally applied, e.g., to QC amplifiers and non-linear mixing elements (such as intracavity difference frequency generators) and to such lasers, amplifiers and non-linear devices that include other types of waveguides (e.g., double insulating plasmon waveguides). The terms "radiation" and "light" are used herein interchangeably to refer to electromagnetic radiation.

FIGS. 1A and 1B schematically depict a conventional terahertz quantum cascade laser 10 that includes an active region (gain medium) 12 that is capable of generating lasing radiation at terahertz frequencies, e.g., in a range of about 1-10 THz corresponding to wavelengths in a range of about 30 to about 300 microns. In some embodiments, the active region 12 can include a plurality of cascaded nominally identical repeat lasing modules 16, which are coupled in series. By way of example, each lasing module can be formed as a GaAs/AlGaAs heterostructure. In some implementations, each lasing module can be formed as a stack of alternating $Al_{0.15}Ga_{0.85}As$ and GaAs layers with an approximate thickness of about 600 angstroms. The number of the lasing modules can range, for example, from about 100 to about 200. Some exemplary thickness values of various layers of such a lasing module are shown in FIG. 1B. In some cases, the active region can have a thickness in a range of about 3 microns to about 10 microns. Some suitable techniques for fabricating the active region can include, without limitation, molecular beam epitaxy (MBE), chemical vapor deposition (CVD), among other suitable techniques. Further details regarding suitable material structures for the active region and methods for formation of the active region can be found in U.S. Pat. No. 7,158,545, which herein is incorporated by reference in its entirety.

The exemplary cascade laser 10 is formed on a substrate 14, e.g., a GaAs substrate, and further includes a double sided metal waveguide that can comprise two parallel metallic layers 18 and 20 formed, e.g., of gold or copper, to confine the lasing modes of the active region. The double-sided metal waveguide tightly confines the radiation field, thus yielding a confinement factor that in many cases is close to unity. Further, the upper and lower metallic layers 18 and 20 can be utilized to apply a selected bias voltage across the active region to cause shifting of the energy levels, and injection of electrons into the active region. In the exemplary quantum cascade laser 10, two heavily doped GaAs upper and lower contact layers 22 and 24 are employed to provide low-resistive contact between the metal layers and the semiconductor active region. In some exemplary implementations, the upper contact layer 22 has a thickness of about 60 nm and a doping level of about $n=5\times10^{18}$ $cm^{-3}$, and the lower contact layer 24 has a thickness of about 100 nm and a doping level of about $n=3\times10^{18}$ $cm^{-3}$, though other doping levels can also be utilized.

In some cases, the metal waveguides can be formed by utilizing a low temperature metal wafer bonding technique followed by substrate removal. For example, a wafer containing a multi quantum well (MQW) structure forming the active region can be coated with a layer of titanium (Ti) (e.g., a thickness of about 20 nm) and a layer of gold (e.g., a thickness of about 100 nm). A receptor wafer can be prepared by depositing successive layers of palladium (Pd), germanium (Ge), palladium (Pd), indium (In), and gold (Au) on a doped n+ GaAs substrate. The two wafers can be bonded together and the GaAs layer can be removed.

With reference to FIG. 1A, the active region includes opposed cleaved facets 23 and 26, which can act as partially transmitting mirrors to provide feedback for lasing action in the active region and to couple light out of the laser cavity. Some studies show calculated values of reflectivity for the facets in a quantum cascade lasers having GaAs/AlGaAs active region can be typically greater than about 60% due to the mismatch between the highly confined optical mode in the cavity and free space modes, in addition to the refractive index mismatch at the interface between the GaAs/AlGaAs active region and air.

Figure 2B:
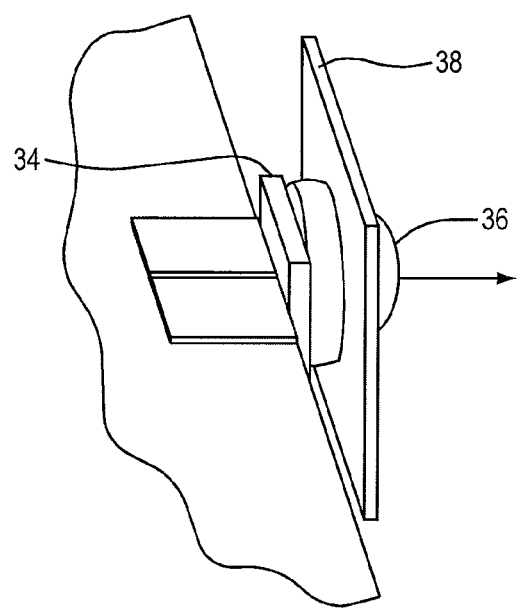

FIGS. 2A and 2B show a quantum cascade laser 28 according to an embodiment of the invention that includes an active region 30 for generating terahertz radiation, e.g., radiation with frequencies in a range of about 1 THz to about 10 THz, e.g., in a range of about 5 THz to about 10 THz, as well as a double-sided metal waveguide 31. The active region and the double sided metal waveguide can be implemented as discussed above in connection with the conventional quantum cascade laser 10 (FIGS. 1A and 1B).

The QC laser 30, however, includes an optical element 32, which in this implementation comprises a spacer 34 and a lens 36. The optical element 32 that is optically coupled to the output facet 23 of the active region so as to increase output coupling of radiation generated in the active region, that is, to enhance the coupling of radiation from the active region to the external environment, and to narrow the angular distribution of lasing radiation emitted by the active region.

More specifically, as shown schematically in FIG. 2B, in this embodiment the spacer 34 is in the form of a slab fabricated from high-resistivity silicon and the lens 36 is a hyper-hemispherical lens of the same material. In this implementation, one surface of the spacer 34 is attached to the output facet of the active region 30, e.g., in a manner discussed in more detail below, and the lens 36 is abutted against the other surface of the spacer and held in place by a retaining clip 38. The radiation produced in the active region is coupled to the external environment through output facet 23, the spacer 34 and the lens 36.

The high-resistivity silicon spacer (e.g., one exhibiting a resistivity greater than about 10 KΩ cm) exhibits low optical loss at the lasing wavelengths (e.g., an optical loss less than about 1 cm$^{-1}$). In this implementation, the silicon spacer has an index of refraction of about 3.4 over the 1-10 THz range that is a close match to the index of refraction of the GaAs/AlGaAs active region, which is about 3.6 in this embodiment.

In this embodiment, the spacer is abutted against the output facet 23 so as to have good contact therewith in order to minimize air gaps between the spacer and the facet. As the index of refraction of the silicon spacer and that of the active region are closely matched, the reflectivity at the output facet is reduced allowing more of the lasing radiation in the active region to "leak" out of that region into the external environment (via the spacer and the lens). In other words, the output coupling of the QC laser is enhanced. The residual reflectivity of the metal-metal waveguide at the interface of the output facet 23 and the silicon spacer due to the remaining optical mode mismatch allows the output facet to also act as the laser's output mirror. The spacer can be glued in position and can protect the delicate output facet from the hemispherical lens. As noted above, in this implementation, the spacer 34 and the lens 36 are formed of the same material, thereby minimizing the reflection of the radiation at the interface of these two components.

In some cases, the optical element 32 can increase the coupling of the lasing radiation generated in the active region into the external environment by a factor in a range of about 3 to about 15. In other words, the optical element can be viewed as lowering the reflectivity of the output facet to the lasing radiation, thereby allowing more of the radiation to leave the active region into the external environment.

Figure 2C:
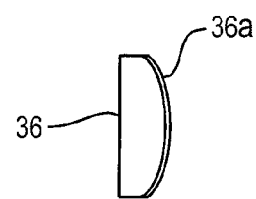

With reference to FIG. 2C, in some embodiments, to minimize the reflection of the laser beam at the silicon-air interface, the lens 36 includes an anti-reflection coating 36a (the thickness of the coating is exaggerated for clarity) which can be, e.g., an approximately 14 micrometers (μm)-thick layer of low-density polyethylene (LDPE, with an index of refraction of about 1.5). This anti-reflection coating acts as a quarter-wave impedance matching layer. In other embodiments, multi-layer dielectric coatings would improve the bandwidth of the anti-reflection properties.

As noted above, in many embodiments, the lens can cause the pattern of an output beam of the laser emerging from the lens to show less angular divergence than a beam emitted by the laser in absence of the lens. Further, the angular divergence of the beam pattern emerging from the lens can be adjusted by adjusting the thickness of the hyperhemisphere. For example, increasing the thickness of the hyperhemisphere can reduce the divergence of the emitted beam, thus increasing the usable power. The lens is preferably as small as possible in order to limit the optical loss, while having a radius of curvature that is large compared with the wavelength. In some implementations, the radius of curvature of the lens is selected to be nominally in the far-radiative field of the facet (e.g., the radius of curvature can be a factor of about 10 larger than the wavelength). A smaller lens has the further benefit of being lighter, thereby allowing a more robust mechanical attachment to the spacer (or in some cases directly to the output facet), e.g., by using an adhesive.

In many implementations, the optical elements 32 is aligned relative to the propagation axis of the terahertz radiation emitted by the laser to optimize the coupling of the lasing radiation into the external environment. For example, an optical axis (OA) of the lens 36 can be aligned with respect to the propagation axis of the lasing radiation. In some cases, such alignment can be characterized by an angle of less than about 15 degrees, and preferably zero, between the optical axis of the lens and the propagation axis of the lasing radiation.

As discussed in more detail below, in some cases, the lens can be aligned relative to the output facet at room temperature, prior to cooling, by employing a thermal camera that allows viewing heat pulses dissipated in the laser active region.

Figure 3A:
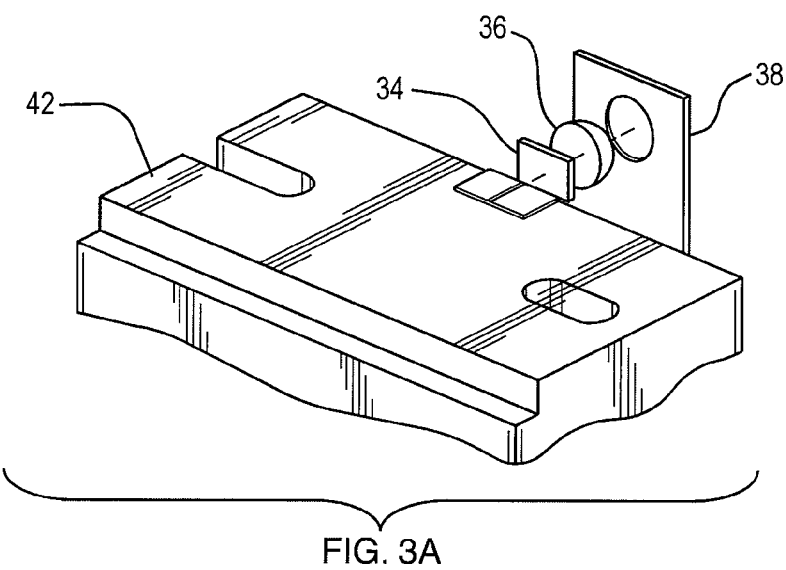
FIG. 3A shows schematically various components of a QC laser according to an embodiment of the invention, FIG. 3B schematically shows the components of FIG. 3A assembled to form the QC laser, FIG. 3C schematically shows a thermal imaging set-up for aligning the lens of the QC laser of FIGS. 3A and 3B relative to the propagation axis of the lasing radiation.
Figure 3B:
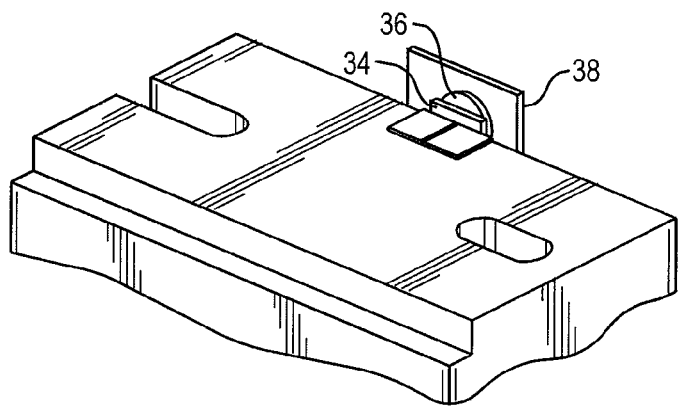
Figure 3C:
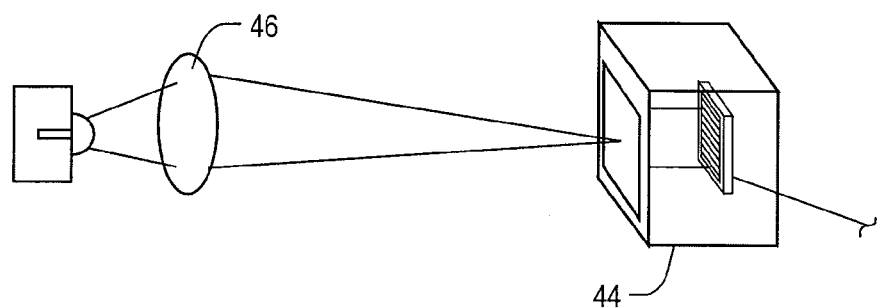

By of example, with reference to FIGS. 3A, 3B and 3C, a thermal imaging camera technique can be employed to align the laser with the optical element. With reference to FIGS. 3A and 3B, in one exemplary method of aligning the laser with the optical element (the combination of the spacer and the lens), a wafer piece 40 containing the QCL lasing medium (active region and the waveguide) is soldered to a copper substrate carrier 42 such that it extends a small distance (e.g., a distance of about 50 microns) beyond the edge of the copper carrier. The high resistivity silicon spacer 34 is held in contact with the QCL wafer by utilizing a die bonding machine. The collet tip is placed in contact with the spacer, above the QCL facet, and a small controlled force is applied to bring the space in contact with the QCL. An ultraviolet (UV) curable adhesive (e.g., Norland 81 (marketed by Norland Products of Cranbury, N.J. U.S.A. or Stycast L-28 (marketed by Ellsworth Adhesives of Germantown, Wis. U.S.A.) is used to fix the spacer in place. Subsequently, the metal clip 38 is employed to hold the high-resistivity silicon lens in contact with the spacer. In an alternative implementation, the lens is affixed to the spacer using a curable adhesive, thereby obviating the need for the metal clip.

With reference to FIG. 3C, following the coupling of the spacer and the lens to the QCL, a thermal infrared camera 44 (e.g., a microbolometer camera such as BAE SCC 500 LWIR camera) is used with appropriate optics, such as a lens 46 (e.g., one or more germanium anti-reflection coated lenses) to image the output facet of the QCL, e.g., while dissipating heat pulses in the active region. A plurality of adjustment screws (not shown) are then used to move the retaining clip, and hence the lens, while monitoring the thermal image of the QCL output facet until the lens is centered with respect to the QCL facet. Optionally, the lens can be glued in position using UV curable glue or epoxy resin, and the retaining clip can be removed.

Figure 4:
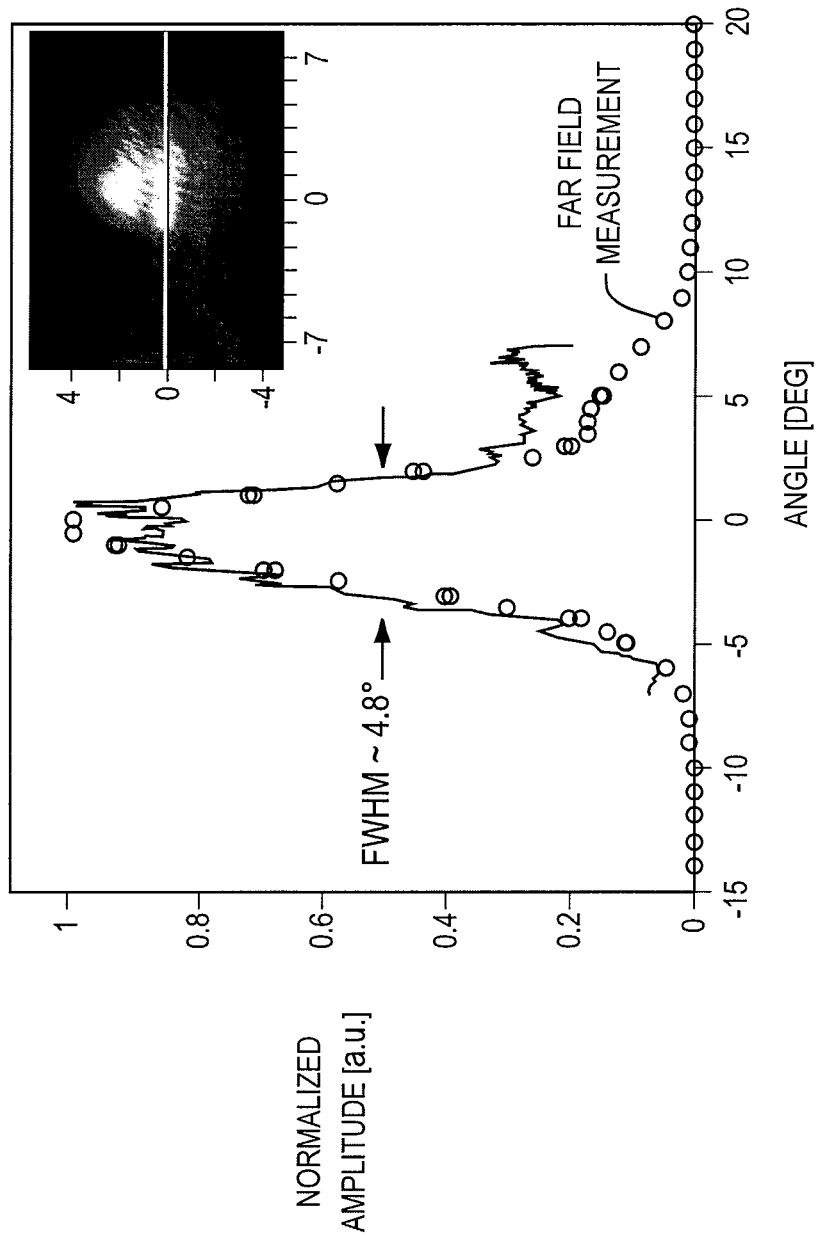
FIG. 4 shows the measured beam pattern in the far-field (30 cm) of a prototype 4.1 THz lens coupled metal-metal QC laser according to an embodiment of the invention, exhibiting a full width at half maximum with FWHM of about 4.8 degrees (inset shows the beam image taken by a microbolometer camera at 6-cm distance), FIG. 5A schematically shows a QC laser according to an embodiment in which a lens is directly coupled to an output of the active region to enhance coupling of the lasing radiation out of the active region into an external environment, FIG. 5B schematically shows a QC laser according to another embodiment in which a spacer (without a lens) is coupled to the output facet of the active region to enhance coupling of the lasing radiation out of the active region into an external environment, FIG. 6A schematically depicts a lens-coupled semi-insulating surface plasmon laser in which an external mirror is used for laser feedback in accordance with an embodiment of the invention.

In some cases, the lens can reduce the divergence of the beam emitted by the QCL, e.g., as characterized by full width at half maximum of the far field beam intensity pattern in a plane perpendicular to the beam's propagation axis, by a factor up to about 50. By way of illustration, FIG. 4 shows the measured 2-D far field beam intensity pattern generated by a prototype terahertz quantum cascade laser according to the teachings of the invention operating at a frequency of 4.1 THz having the structure described above in connection with the above FIGS. 2A and 2B, and discussed in more detail below in Example 1. The observed beam pattern is significantly improved relative to beam patterns generated by conventional devices, which typically generate beam patterns with divergence angles greater than 180°. The beam pattern of the prototype device shown in FIG. 4 provides a number of advantages, e.g., it allows uniform illumination of an object in an imaging system.

Further, the prototype QC laser exhibited a substantial improvement in output power relative to conventional QC lasers, as discussed further below. By way of example, for a QC laser having a metal-metal waveguide that would produce a peak power of about 26 mW using a light pipe collector (Winston cone) in the absence of the spacer 34 and the lens 36, an output power of about 145 mW was observed when its output facet was coupled to a lens and a spacer in a manner discussed above. In other words, the use of the spacer and the lens resulted in approximately 5.5× improvement in the output power. When compared with the same device lacking the lens and the spacer without a light pipe collector, the use of the lens and the spacer resulted in an improvement of about 23× in the output power. Because the lens and the spacer increase the output coupling, and hence the overall loss, a slight reduction in the maximum operating temperature ($T_{max}$) was observed: the prototype device operated up to about 160 K with the lens, down form about 165 K maximum operating temperature without the lens. The large improvement in the output power with a marginal loss in $T_{max}$ indicates that coupling an optical element (e.g., a lens and spacer) to a QC device can be advantageous for the present and future generations of such devices. For example, when $T_{max}$ begins to approach about 200 K, metal-metal terahertz QC lasers can be compatible with compact, thermoelectric coolers, greatly enhancing their user friendliness.

Figure 5A:
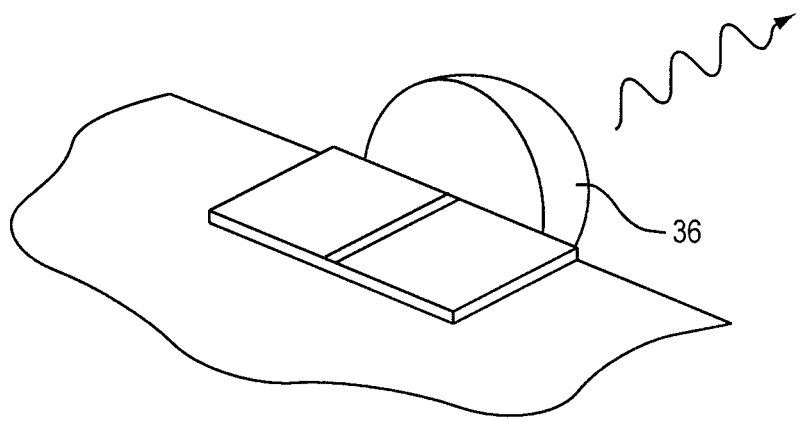
Figure 5B:
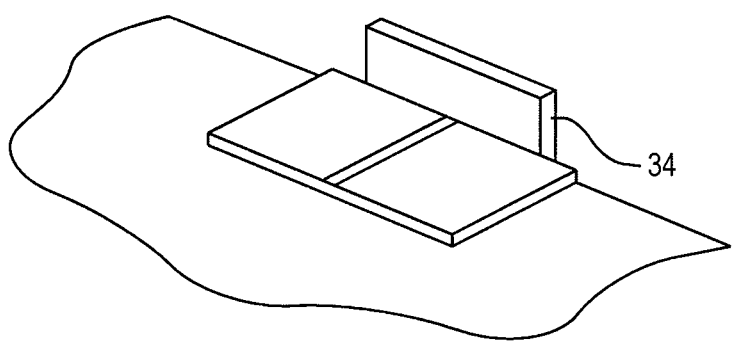

As shown schematically in FIG. 5A, in some implementations, the lens 36 can be coupled directly to an output facet of the QCL active region without utilizing a spacer. Further, in some other implementations in which reducing the divergence of the output radiation is not of concern, only the spacer 34 can be employed without the lens, as shown schematically in FIG. 5B.

Figure 6A:
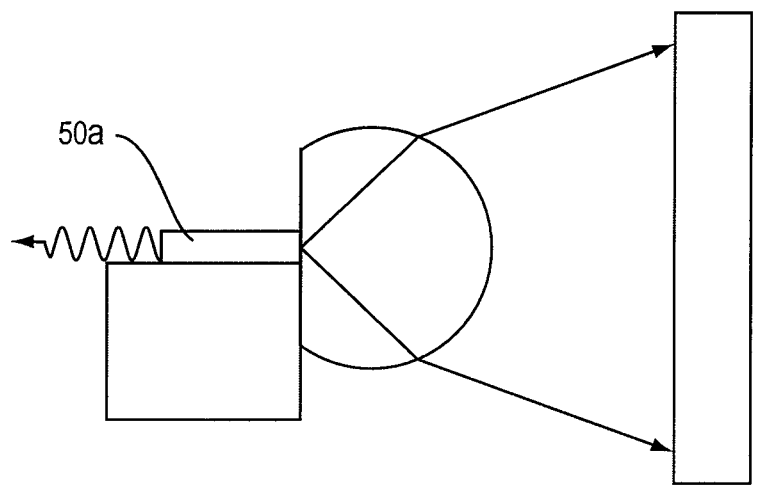
FIG. 6B is a schematic cross-sectional view of the various components of the laser shown in FIG. 6A.

In another aspect, the invention utilizes coupling of an optical element (e.g., a lens) to a QC laser to reduce and/or suppress lasing and employs an optical element (e.g., a mirror) external to the laser's active region to provide optical feedback in order to initiate lasing action. By way of example, FIG. 6A schematically depicts such a QC laser 48 that operates in the terahertz region of the electromagnetic spectrum (e.g., in a range of about 1 THz to about 10 THz). The exemplary laser 48 includes an active lasing region 50. As shown schematically in FIG. 6B, in this embodiment, a semi-insulating plasmon waveguide is utilized, which comprises a metallic layer 52 and a heavily doped surface plasmon layer 54, above a nominally undoped semi-insulating GaAs layer 56. The metal layer can be similar to the metal layers discussed above in connection with the QCL 28 shown in FIGS. 2A and 2B. The heavily doped plasmon layer can be formed, e.g., 400-nm thick gallium arsenide with a silicon dopant concentration of about $3 \times 10^{18}$ cm$^{-3}$.

Figure 6B:
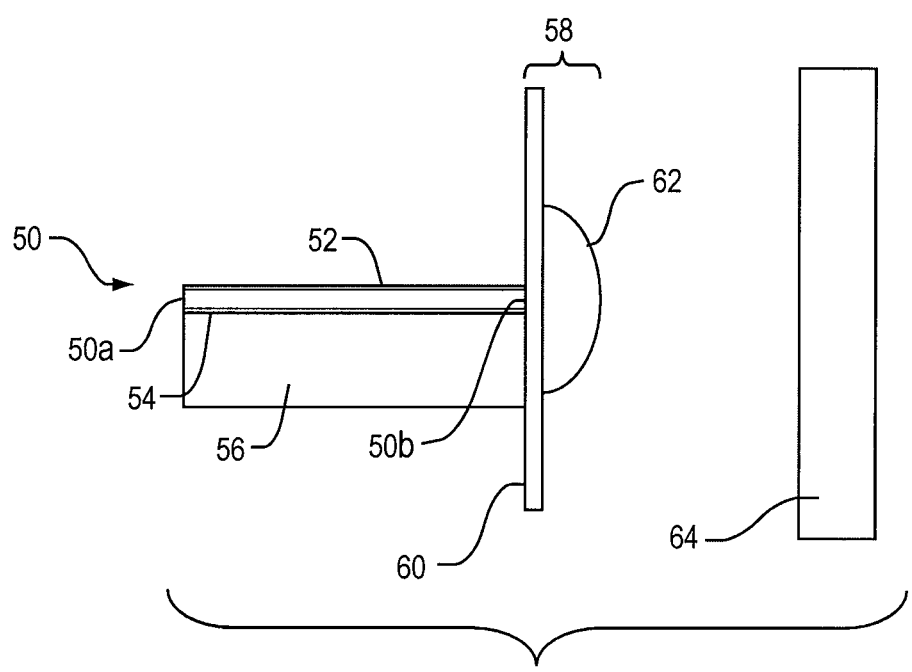

With continued reference to FIGS. 6A and 6B, the lasing radiation is coupled from the active region through an output facet 50a thereof to the external environment. The active region includes an opposed facet 50b to which an optical element 58 comprising a spacer 60 and a lens 62 (e.g., the spacer and the lens discussed above in connection with the previous embodiments) is optically coupled so as to reduce the reflectivity of the radiation generated in the active region at that facet (similar to the previous embodiment the lens can be held in place by a retainer). For example, without the lens and the spacer, QC devices having such waveguides can exhibit reflectivities of about 32% due to index of refraction mismatch. Coupling the device to a high-resistivity silicon spacer and a lens, as shown in FIGS. 6A and 6B, can significantly reduce the reflectivity value, thus adding to optical loss. This can in turn reduce and/or suppress lasing. In other words, the optical element 58 effectively increases the loss of the laser cavity by enhancing leakage of the radiation through the opposed facet 50b out the cavity, thereby reducing and/or suppressing lasing.

In this implementation, a mirror 64 is positioned external to the active region to provide optical feedback (by reflecting at least a portion of radiation "leaked" from the active region through the spacer and the lens incident thereon back to the active region) to cause lasing action, thereby providing an external cavity laser. Although in the above implementation, a lens and a spacer are employed to reduce reflectivity of the opposed facet 50b of the active region, in other cases an optical element with the requisite refractive index but without any substantial focusing capability, e.g., a flat slab, can be utilized.

Figure 7A:
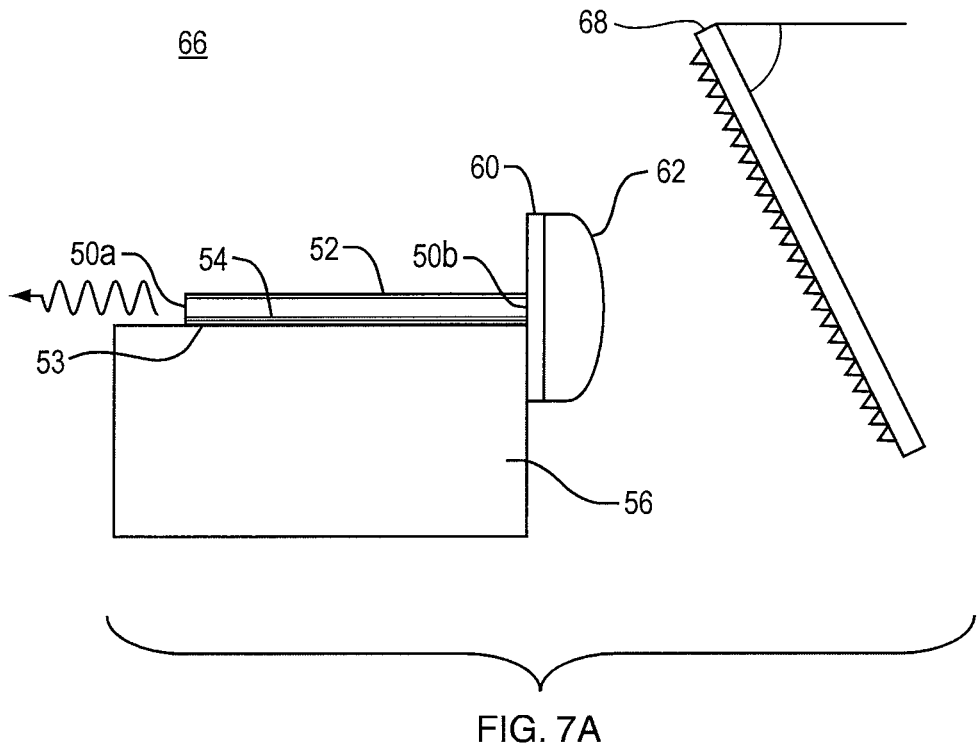
FIG. 7A is a schematic view of a tunable external cavity laser according to an embodiment of the invention that employs a reflective grating for frequency selective optical feedback, FIG. 7B schematically depicts a mechanism for rotating the reflective grating of the laser of FIG. 7A in order to tune the lasing frequency.

In some embodiments, an external cavity laser having a frequency selective element external to the active region for providing optical feedback can allow frequency tuning of the radiation emitted by the laser. By way of example, FIG. 7A schematically shows an exemplary implementation of such an external cavity laser 66, which similar to the laser 48 shown in FIG. 6A includes an active region 50 for generating terahertz radiation (e.g., radiation with frequencies in a range of about 1 THz to about 10 THz) and a semi-insulating plasmon waveguide formed by a heavily doped surface plasmon layer 54, which is disposed on a semi-insulating layer 53 (typically a layer having a thickness of about 100-300 microns that is formed of high resistivity gallium arsenide), and a metallic layer 52. The lasing radiation generated in the active region is coupled via a facet 50a of the active region to the external environment. An opposed facet 50b of the active region is coupled to a spacer 60 and a lens 62 (formed, e.g., of high resistivity silicon) that function similarly to the spacer and the lens utilized in the above QCL laser 48 to suppress and/or quench lasing by enhancing the leakage of lasing radiation out of the active region through the facet 50b.

In this implementation, a reflective grating 68 in Littrow configuration provides optical feedback to the active region. The use of the lens creates a collimated beam allowing a large fraction of the light to be reflected by the grating back into the active region. Adjustment of the grating angle (e.g., by utilizing a mechanism that allows rotating the grating relative to the propagation direction of the radiation) allows the selection of the radiation wavelength to be reflected back into the active region. This feedback allows lasing to occur at the selected radiation wavelength while lasing at the other radiation wavelengths remains quenched. The radiation output of the device is taken from the opposite facet so that the beam pattern is largely unaffected by the grating angle. In this manner, a desired lasing wavelength can be achieved.

Figure 7B:
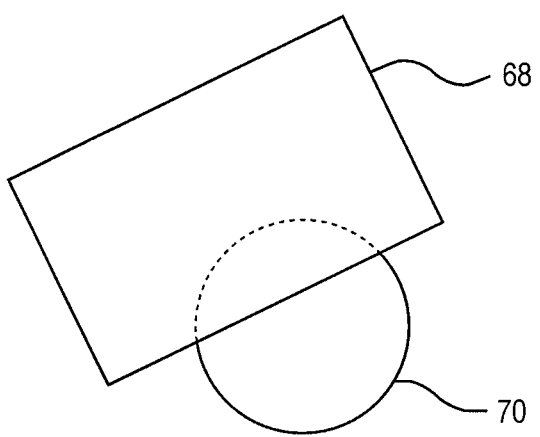
FIG. 7C is a schematic top view of another embodiment of a tunable terahertz laser according to the teachings of the invention, FIG. 8 schematically depicts an interferometric system according to an embodiment of the invention, FIG. 9 schematically depicts an interferometric system according to an embodiment of the invention having a bank of tunable QC lasers as radiation sources, FIG. 10 schematically depicts a terahertz amplifier according to an embodiment of the invention.

In other words, the wavelength of the lasing radiation generated by active region 50 can be tuned over a range of wavelengths by adjusting the grating angle. A variety of mechanisms known in the art can be employed to rotate the grating relative to the propagation axis of the radiation so as to tune the lasing wavelength. By way of example, with reference to FIG. 7B, the grating 68 can be mounted to a rotating stage 70 and a which can be controlled manually or motorized and controlled by a computer (e.g., rotation mount marketed by Thorlabs of Newton, N.J. U.S.A. under trade designation CR1-C7E), which adjusts the grating angle for tuning the lasing wavelength.

In some cases, the tunable laser 66 can exhibit a tunability over a bandwidth of about 4% of the center frequency.

Figure 7C:
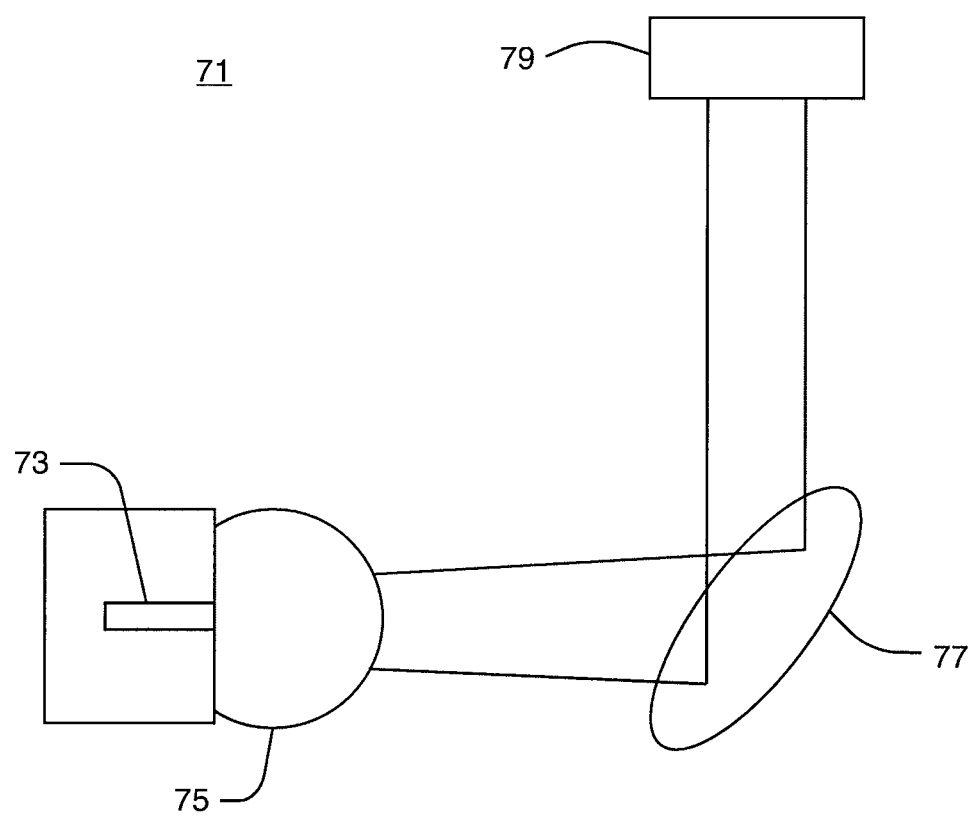

FIG. 7C schematically depicts another embodiment of a tunable terahertz laser 71 according to the teachings of the invention that includes a medium 73 (comprising an active region and a semi-insulating plasmon waveguides, such as those discussed above) for generating terahertz radiation (e.g., in a frequency range of about 1 THz to about 10 THz). A hyperhemispherical lens 75 (such as the lenses discussed above) is optically coupled to an output facet of the active medium to facilitate coupling of the radiation out of the active medium to the external environment and to decrease the divergence of the output beam. An off-axis parabolic mirror 77, preferably exhibiting low optical loss, collimates the beam emerging from the hyperhemispherical lens and directs the collimated beam to a grating 79. The radiation returning from the grating is reimaged onto the output facet of the active medium by the off-axis parabolic mirror 77 and the lens 75 to provide optical feedback to the active medium. Similar to the previous embodiment, in absence of the optical feedback from the grating, the lens can reduce, or quench, the lasing in the active region by effectively increasing the optical loss of the active medium. The optical feedback from the grating can overcome this loss to initiate lasing at one or more frequencies. By adjusting the angle of the grating, different lasing frequencies can be obtained.

A tunable terahertz radiation source such as the above laser 66 (FIG. 7A) can find a variety of applications. For example, it can be used as the radiation source in a tomographic imaging system. By way of example, FIG. 8 schematically shows such a tomographic imaging system 72, which is similar to a swept source optical coherence tomography system (SS-OCT) and in which a tunable quantum cascade laser according to the teachings of the invention (e.g., the QC laser shown in FIG. 7A) is employed as the radiation source.

The output radiation of the tunable QC laser 66 is split by a beam splitter 74 of a Michelson interferometer into a reference arm and a sample arm. The beam splitter can be made of a thin film of semi-transparent material (e.g., Mylar™, high-resistivity silicon or a film of conductive material such as indium tin oxide disposed on Mylar or high-resistivity silicon). The beam traveling through the reference arm is reflected by a reference mirror 76 and the beam traveling through the sample arm is incident on a sample 78 under study and is at least partially reflected by the sample. The beam reflected by the mirror passes through the beam splitter to be recombined with the beam reflected by the sample as it is reflected by the beam splitter. The recombined beam can be detected by utilizing, e.g., a single element or a focal plane array detector 80. The depth of the sample can be determined by sweeping the lasing frequency of the QCL and/or moving the reference mirror, and Fourier transforming the detected signal, e.g., via an analysis module (not shown).

Figure 9:
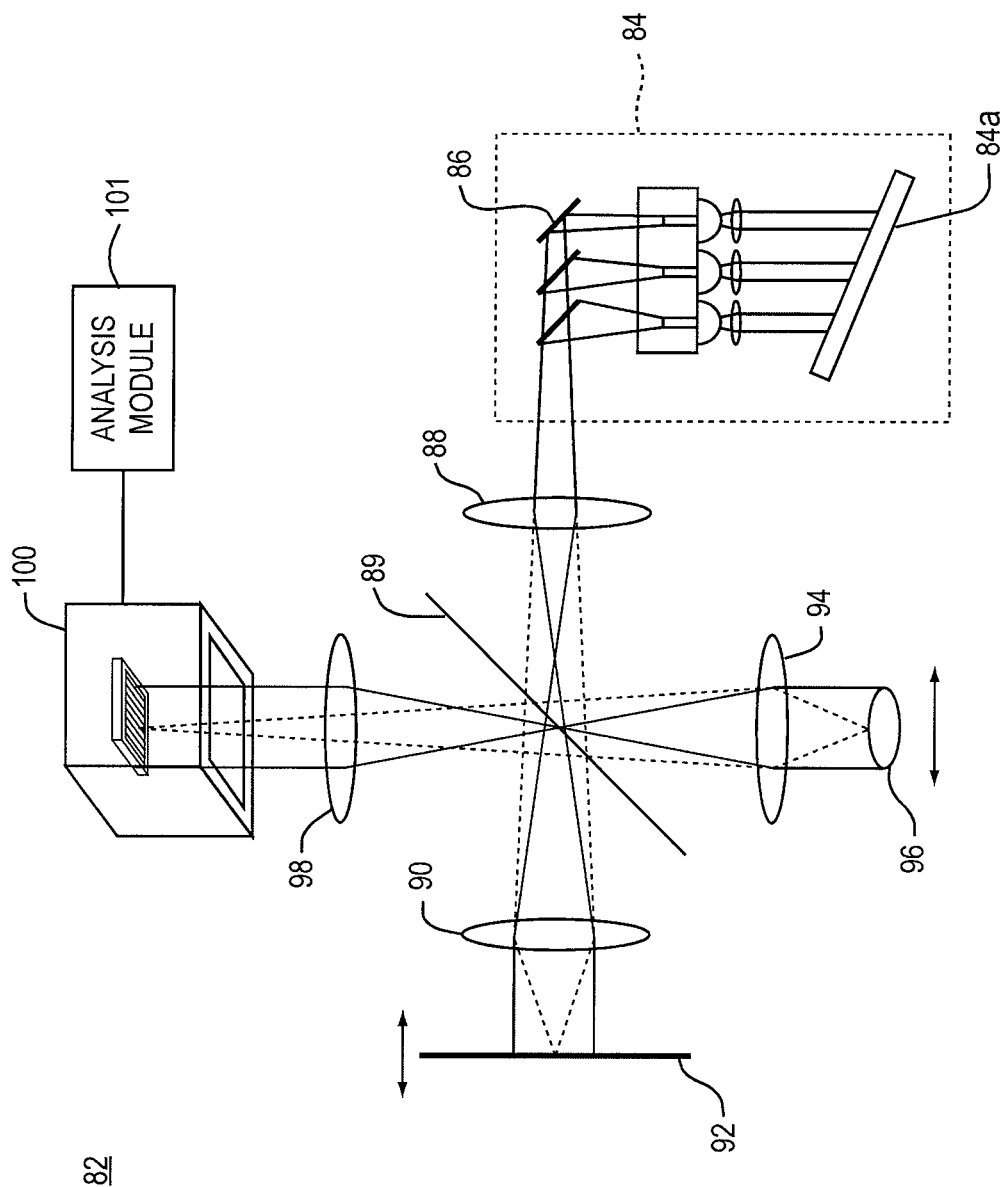

For further illustration of the use of tunable QC laser according to the teachings of the invention in optical coherence tomography, FIG. 9 schematically depicts an exemplary terahertz swept source optical coherence tomography imaging system (THz SS-OCT) 82 according to an embodiment of the invention that includes a bank of tunable QC lasers 84, each of which provides terahertz lasing radiation at a different central frequency and each of which can be tuned, e.g., via an external grating 84a in a manner discussed above in connection with the tunable QCL 66, over a bandwidth around that central frequency. The radiation generated by the QC lasers can be spatially combined using, e.g., a plurality of silicon dichroic mirrors 86. Although in this implementation, three terahertz QCLs operating at different frequencies are shown, those having ordinary skill in the art will appreciate that other numbers of QCLs can also be employed.

With continued reference to FIG. 9, a lens 88 (e.g., a cylindrical lens in this implementation) focuses the radiation from each tunable QCL through a beam splitter 89, which in turn splits the radiation into a reference arm and a sample arm of a Michelson interferometer. A lens 90 in the reference arm focuses the radiation onto a reference mirror 92 (e.g., the focused radiation can be in the form of a line), and directs the radiation reflected by the reference mirror in response to the incident focused radiation back towards the beam splitter. Another lens 94 focuses the radiation onto a sample 96 under interrogation, and directs the radiation reflected by the sample back to the beam splitter. At least a portion of the radiation reflected by the mirror is reflected by the beam splitter onto a lens 98 (e.g., a cylindrical lens) and at least a portion of the radiation reflected by the sample passes through the beam splitter to reach the lens 98. The lens 98 in turn focuses the radiation reflected by the reference mirror and the sample onto a microbolometer array 100 to be detected. By way of example, in this implementation, the microbolometer array can be a commercial 320×240 pixel, uncooled, vanadium oxide (VOx) microbolometer focal-plane array camera marketed under trade designation SCC500 by BAE systems of Lexington, Mass., U.S.A. In this exemplary implementation, the focused illuminating radiation forms a 25-mm line and is imaged onto a 320 pixel row of the microbolometer array, corresponding to a lateral resolution of about 75 micrometers.

By sweeping the lasing frequency of a QCL synchronously with the data acquisition of the microbolometer array, an interferogram can be obtained. The Fourier transform of the interferogram can provide a measure of the layer structure of the sample. By way of example, an analysis module 101 can receive the interferogram and apply a Fourier transform to the interferogram to determine information about the sample. The depth resolution ($\Delta x$) can be limited by the tuning range of the source: ($\Delta x = c/4 \, \Delta f$), where c is the speed of light and ($\Delta f$) is the tuning range of the source. In some embodiments, the tuning range of the each QCL can be in a range of about 150 GHz to about 500 GHz resulting in a depth resolution in a range of about 2 mm to about 600 microns. As noted above, in this embodiment multiple QCLs operating at different frequencies are employed, which further enhance the depth resolution.

The above OCT system can be employed to interrogate a variety of different samples. By way of example, the system can be utilized to evaluate coatings of pharmaceutical tablets. Pharmaceutical tablets in controlled-release and sustained-release formulations typically include a core containing the active pharmaceutical ingredient and one or more 10 to 100 micron thick polymer coatings. These coatings allow site-specific delivery of the active ingredient where uptake may be higher (controlled-release) or prolonging the uptake of the active ingredient in order to prevent toxicity or improve dosage (sustained-release). The polymer coating can also create a moisture and light barrier to prevent tablet degradation and can also mask the taste and odor of the tablet core, thereby improving patient compliance.

The above OCT system can be employed to obtain a 3-D scan of such coatings, e.g., to determine whether the coatings include defects that can occur during manufacturing, which can adversely affect the dissolution performance of the tablet. In other applications, the above terahertz OCT system can be utilized for non-destructive evaluation of paints. For example, in automotive industry where paints are used for rust prevention, waterproofing and coloring, conventional paint thickness measurements by ultrasound and eddy-current meters rely on integral contact with the surface, which precludes their use during drying for in-process monitoring. In contrast, the above terahertz OCT system allows in-process monitoring of paints. Further, the terahertz OCT system can be employed to analyze metals underneath paint layers, e.g., for potential rust failure. The use of terahertz radiation for such applications is advantageous as the use of visible or near-infrared radiation for non-contact measurements is not practical as many paints are opaque to such radiation wavelengths.

In other aspects, semiconductor optical amplifiers are disclosed that can operate in the terahertz regime, e.g., in a range of about 1 THz to about 10 THz. By way of example, the semi-insulating surface plasmon laser 48 can be converted into a semiconductor optical amplifier 102 if lasing is suppressed and no optical feedback element is used, as shown schematically in FIG. 10. Radiation, which is either passively generated from the environment or from an active terahertz source 104, is coupled through the lens 62, spacer 60 and opposed facet 50b into the waveguide. This radiation is amplified by the active region 50 as it passes through the waveguide. The radiation passes through the output facet 50a where it is detected by a detector element 106. This element can be butt-coupled to the output facet, to reduce reflectivity and improve optical coupling. However, in many cases, the suppression of the reflection from the butt-coupling of the output facet is not necessary as those reflections will not cause unwanted lasing due to low optical feedback from the opposed facet (i.e., in many cases the reflection from one of the two laser mirrors needs to be reduced (or eliminated) to suppress lasing). Suitable detection elements include, for example, hot-electron bolometers, pyroelectric detectors, Schottky diodes, photodetectors and terahertz quantum-well infrared photodetectors (QWIPs).

Generally, terahertz QC lasers can provide advantages relative to other types of terahertz sources in that they are high-power, compact and can be designed to operate over a continuous range of, e.g., about 1.2 to about 4.9 THz. In contrast, pulsed and far-infrared gas laser terahertz sources typically provide low power (pulsed sources), cannot continuously cover the terahertz spectral range (gas laser sources) and/or are not compact (gas laser source). As such, QC lasers can be more effective for applications such as imaging, where high average power can be required for obtaining good signal-to-noise ratios, and frequency tenability is desired.

Moreover, the terahertz QC lasers of the invention, such as those discussed above, can provide improvements and advantages relative to conventional terahertz QC lasers. For example, the lens-coupling approach discussed above can significantly improve the output power and beam pattern attainable from a QC laser, while trading off a small amount of maximum operating temperature. Further, as the maximum operating temperature of terahertz QC lasers approaches about 200 K, lens-coupled metal-metal terahertz QC lasers can be compatible with compact, thermoelectric coolers, thus enhancing their usefulness.

A frequency tunable QC laser according to the teachings of the invention, such as the above QC laser 66, will have several advantages over conventional terahertz sources such as the far-infrared gas laser. For example, the far-infrared gas laser requires a change of gas to achieve frequency tunability, thus rendering its use in spectroscopic applications cumbersome.

As noted above, the terahertz QC lasers of the invention can be utilized in a variety of applications. For example, they can be utilized for spectroscopic detection of chemical compounds, many of which exhibit distinct spectroscopic absorption features at terahertz frequencies. Another application includes measuring the thickness of visibly opaque coatings and films. Some visibly opaque materials such as pharmaceutical tablets and capsule coatings and paints can become somewhat transparent at terahertz frequencies. For example, coatings can control the release of active ingredients into the body in many pharmaceutical products, as well as protect the product from moisture and oxidation, thus extending the product's shelf life. As discussed above, terahertz radiation can be employed, e.g., to characterize the physical integrity of such coatings for quality assurance monitoring. Further, terahertz radiation can be employed for non-contact, in-process measurement of paint film thickness, which can provide improvement over current technology that is based on contact measurements. Terahertz frequencies are particularly attractive for these applications because these frequencies are non-ionizing and hence are non-destructive. In addition, such terahertz radiation is sufficiently short in wavelength to provide good image resolution.

By way of another example, the QC lasers of the invention can be employed to monitor the integrity of semiconductor packages. IC packages can be investigated by conventional methods to verify, e.g., the metal interconnects can require prohibitively long data acquisition times (e.g., greater than about 10 min per package). Semiconductor integrated circuit (IC) packages are typically visibly opaque but are partly transparent at terahertz frequencies.

The following example is provided to further elucidate various aspects of terahertz devices according to some embodiments of the invention. The examples are presented only for illustrative purposes, and are not intended to indicate necessarily the optimal performance of the devices according to the teachings of the invention.

Example 1

A prototype QC laser based on resonant-phonon depopulation design was fabricated, which provided lasing radiation at 4.1 THz. The active region had a similar design to the design discussed above in connection with FIGS. 1A and 1B, and also described in B. S. Williams, S. Kumar, Q. Hu, and J. L. Reno, "High-power terahertz quantum-cascade lasers," *Electron. Lett.* 42, 89 (2006), which is herein incorporated by reference. A metal-metal (MM) waveguide was employed for mode confinement. The MM waveguide was fabricated using a wet etching processing technique described in S. Kumar, B. S. Williams, Q. Qin, A. W. Lee, Q. Hu, and J. L. Reno, "Surface-emitting distributed feedback terahertz quantum-cascade lasers in metal-metal waveguides," *Optics Express* 15, 113 (2007), which is herein incorporated by reference, with the waveguide oriented so that the facets could be defined by cleaving.

An approximately 80 micron wide by 1.94 mm long device was aligned and indium soldered to a copper carrier so that the output facet was flush with the carrier edge, allowing a double-side polished, 340 micron thick, high-resistivity silicon (HRSi, >10KΩ cm) spacer to be epoxied to the carrier and remain in contact with the facet. Close positioning of the spacer was important to avoid gaps between the facet and spacer, which would adversely affect the output power. The fixed spacer provided a mating surface for the high-resistivity silicon (HRSi) lens and also served to prevent damage to the facet during lens alignment.

The lens had a 3 mm diameter and a total length of 1.62 mm, making the total setback from the center 0.46 mm, roughly at the R/n aplanatic point described by D. B. Rutledge, D. P. Neikirk, and D. P. Kasilingam in *Infrared and Millimeter Waves*, Vol. 10, K. J. Button, ed. (Academic 1983), pp. 1-90, which is herein incorporated by reference. To reduce reflections at the lens surface, the lens was antireflection (AR) coated using an approximately 14 micron thick layer of low-density polyethylene (LDPE, refractive index approx. 1.5) which acted as a quarter-wave matching layer at the lasing frequency of 4.1 THz. A transmission of more than 90% was deduced for the Si/LDPE/air interface using a separate test sample. The lens was positioned against the spacer and held in contact by a spring steel retaining clip. The position of the lens with respect to the facet was aligned at room temperature by dissipating heat pulses in the device and imaging the facet onto an infrared microbolometer camera operating in differential mode as described in A. W. M. Lee, B. S. Williams, S. Kumar, Q. Hu, and J. L. Reno, "Real-Time Imaging Using a 4.3-THz Quantum Cascade Laser and a 320×240 Microbolometer Focal-Plane Array," *IEEE Photon. Technol. Lett.* 18, 1415 (2006), which is herein incorporated by reference.

Figure 11A:
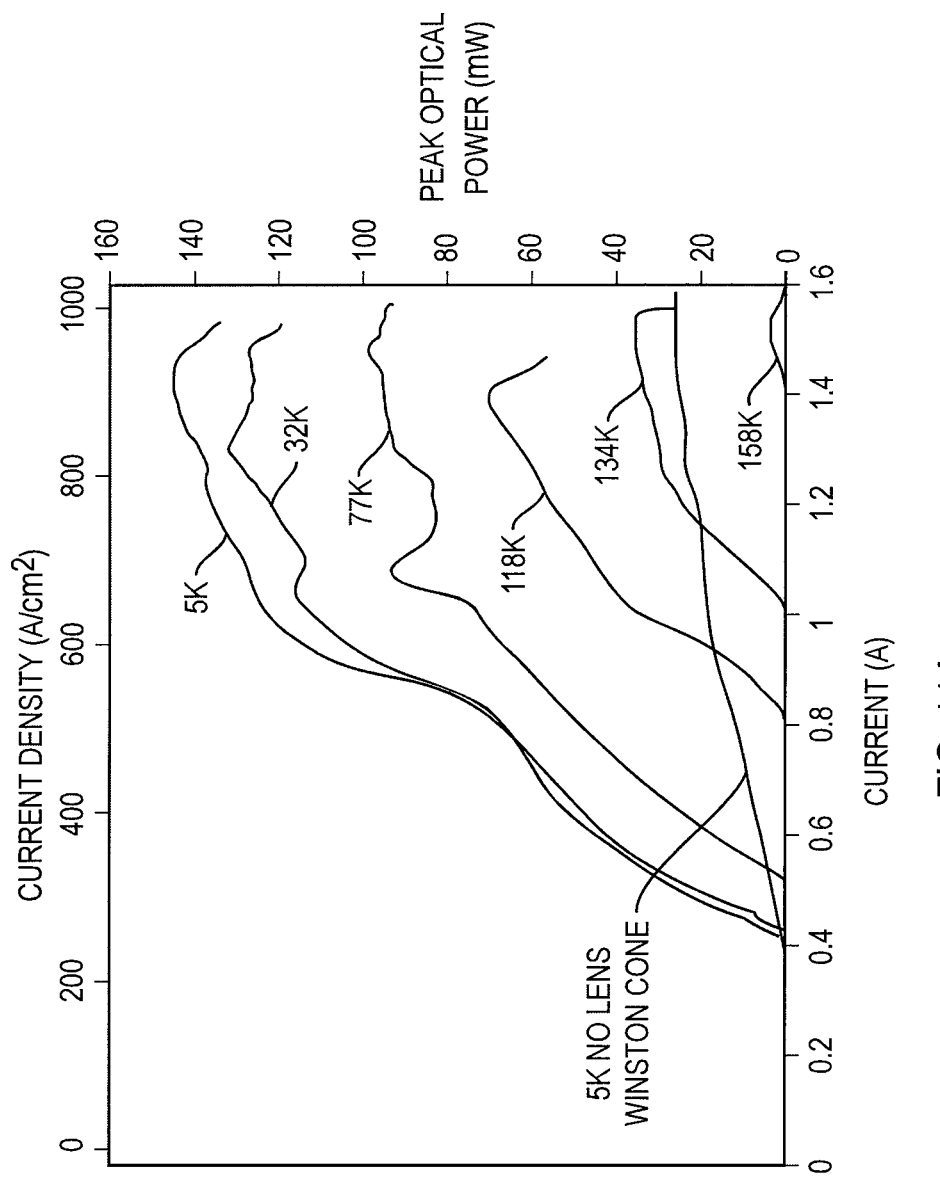
FIG. 11A shows output power versus current for a prototype 4.1 THz lens coupled metal-metal QC laser according to an embodiment of the invention compared to the same metal-metal QC laser without a lens.

The device was mounted in a vacuum cryostat with a polypropylene window and biased with 200 ns pulses repeated at 50 kHz for a total duty cycle of 1%. The output power was measured versus current using a pyroelectric detector, with the peak power calibrated with a thermopile powermeter (ScienTech model AC2500H). At 5 K, the threshold current density ($J_{th}$) was 266 A/cm$^2$ with a maximum peak power of 145 mW with lasing observed up to 160 K, as shown in FIG. 11A. The slope efficiency was dL/dI=296 mW/A near threshold and was 140 mW/A at the peak, with a maximum wall-plug power efficiency of 0.7%. For comparison with an open facet, the lens and spacer were removed and the device was tested using a Winston cone to collect the emitted power. As shown in FIG. 11A, the threshold current density ($J_{th}$) for the Winston cone-coupled device at 5K was 254 A/cm2 with a maximum peak power of 26 mW lasing up to 165 K.

Figure 11B:
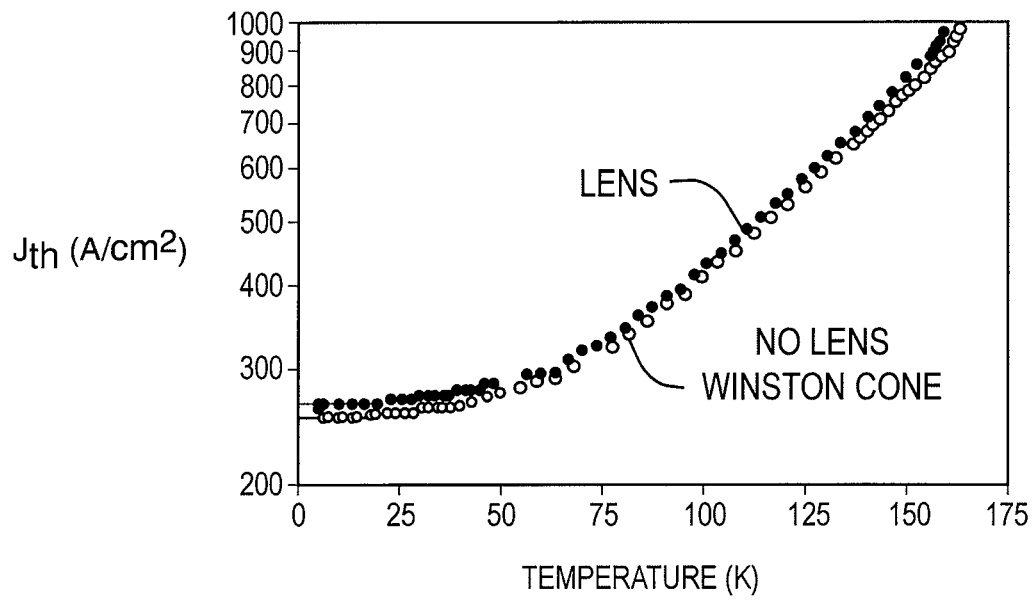
FIG. 11B shows threshold current density ($J_{th}$) versus temperature for a prototype 4.1 THz lens coupled metal-metal QC laser according to an embodiment of the invention compared to the same metal-metal QC laser without a lens.
Figure 11C:
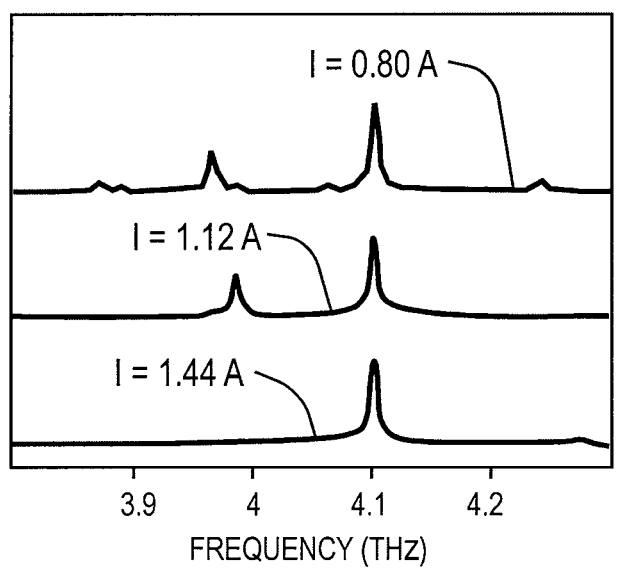
FIG. 11C shows typical spectra from a conventional semi-insulating surface plasmon fabry-perot terahertz laser at different bias currents.

FIG. 11B shows the threshold current density as a function of the laser's operating temperature, exhibiting a slightly higher threshold density for the laser with the lens. FIG. 11C shows typical spectra from a conventional semi-insulating surface plasmon fabry-perot device at various bias currents.

Example 2

A prototype tunable terahertz laser operating at a frequency of 4.1 THz with an active region having the structure similar to that shown above in FIG. 1B was fabricated (the structure was the same as that described in B. S. Williams, S. Kumar, Q. Hu, and J. L. Reno, "High-power terahertz quantum-cascade lasers," *Electron. Lett.* 42, 89 (2006), referenced above. A semi-insulating plasmon waveguide was employed for mode confinement. The waveguide consisted of a layer of metal (20-nm of titanium covered with 200 nm of gold), above the active region, above a surface plasmon layer (400 nm thick gallium arsenide doped with silicon at a concentration of about 3×10$^{18}$ cm$^{-3}$) which in turn was above a semi-insulating substrate (high-resistivity gallium arsenide). The 3-mm diameter hyperhemispherical lens was made of high resistivity silicon, with a setback near the R/n point. The f/2, 2-inch diameter off-axis parabolic mirror was formed of aluminum with a coating of gold and the grating was formed of aluminum that was blazed at an angle of 26.75 degrees at 7.9 grooves per millimeter (peak wavelength 111 microns).

Figure 12:
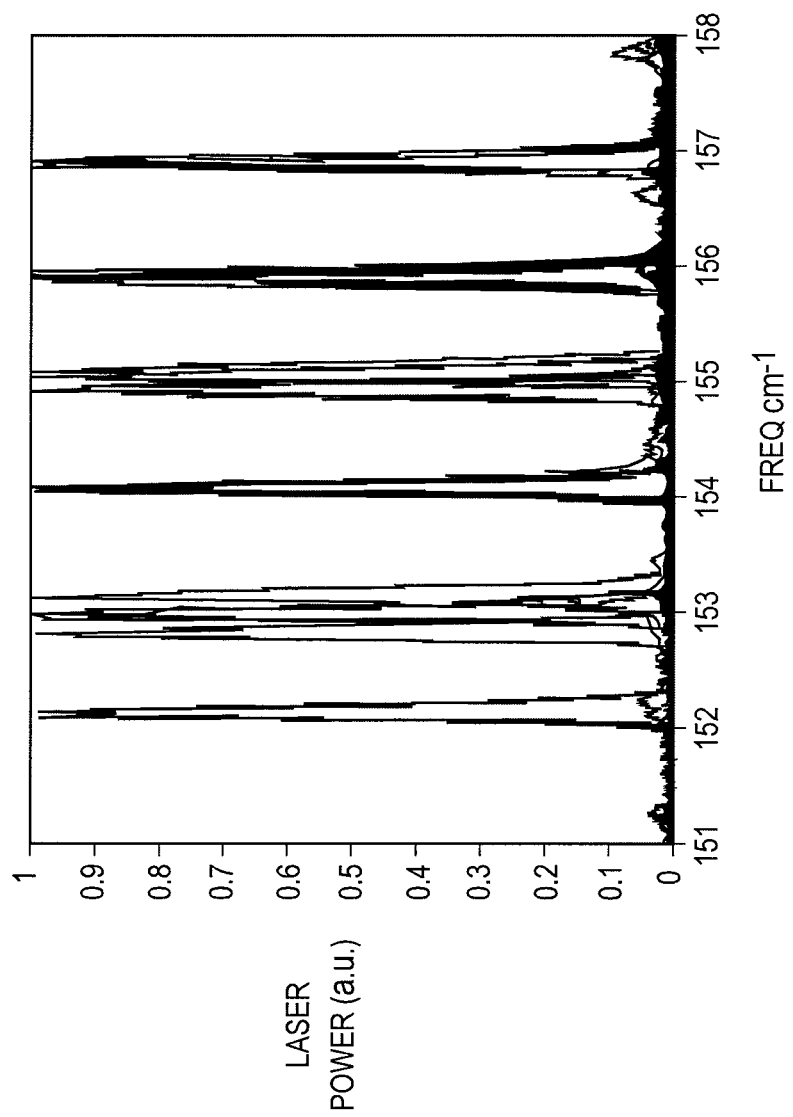
FIG. 12 shows exemplary frequency tuning exhibited by a prototype tunable QC laser according to an embodiment of the invention.

FIG. 12 depicts the results of frequency tuning of this prototype laser by adjusting the grating angle.

The invention claimed is:

1. A quantum cascade laser, comprising:
   an active region for generating lasing radiation in a frequency range of about 1 to about 10 Terahertz, said active region having an output facet through which radiation is coupled to an external environment, and
   a waveguide formed of an upper metallic layer and a lower metallic layer, each layer being disposed on a surface of said active region so as to confine one or more modes of said lasing radiation within said active region, and
   an optical element optically coupled to said output facet and in physical contact therewith so as to enhance coupling of radiation from the active region to the external environment.

2. The quantum cascade laser of claim 1, wherein said optical element has an index of refraction intermediate that of the active region and the external environment to provide index matching between the active region and the external environment.

3. The quantum cascade laser of claim 1, wherein said optical element comprises a lens and a spacer.

4. The quantum cascade laser of claim 3, wherein the spacer is disposed between said lens and said output facet of the active region such that a surface of said spacer is in contact with said output facet and another surface of the spacer is in contact with the lens.

5. The quantum cascade laser of claim 4, wherein said spacer is formed of a material having an index of refraction that is different from that of the active region by less than about 50%.

6. The quantum cascade laser of claim 1, wherein said lens comprises a hyperhemispherical lens.

7. The quantum cascade laser of claim 1, wherein said lens is adapted to cause narrowing of a pattern of radiation emitted by said active region.

8. The quantum cascade laser of claim 1, wherein each of said metallic layers has a thickness in a range of about 0.1 to about several microns.

9. The quantum cascade laser of claim 1, wherein at least one of said metallic layers comprises a single layer structure formed of a selected metallic compound.

10. The quantum cascade laser of claim 1, wherein at least one of said metallic layers comprises a multi-layer structure, the layers being formed by at least two different metallic compounds.

11. The quantum cascade laser of claim 9, wherein at least one of said metallic layers comprises a layer of gold.

12. The quantum cascade laser of claim 1, wherein said active region comprises a semiconductor heterostructure providing a plurality of lasing modules connected in series.

13. The quantum cascade laser of claim 12, wherein each lasing module comprises
a plurality of quantum well structures collectively generating at least an upper lasing state, a lower lasing state, and a relaxation state such that said upper and lower lasing states are separated by an energy corresponding to an optical frequency in a range of about 1 to about 10 Terahertz, and
wherein electrons populating said lower lasing state exhibit a non-radiative relaxation via resonant emission of LO-phonons into said relaxation state.

14. The quantum cascade laser of claim 13, further comprising two contact layers each disposed between a surface of said semiconductor heterostructure and one of said metallic layers.

15. The quantum cascade laser of claim 14, wherein each contact layer comprises a heavily doped semiconductor.

16. The quantum cascade laser of claim 15, wherein said heavily doped semiconductor layer comprises a GaAs layer having a doping level of about $10^{18}$ cm$^{-3}$.

17. The quantum cascade laser of claim 12, wherein said semiconductor heterostructure is formed as alternating layers of GaAs and Al$_x$Ga$_{1-x}$As, wherein x can be in a range of about 0.05 to 0.4.

18. The quantum cascade laser of claim 1, further comprising:
a reflective element disposed external to said active region to provide optical feedback to cause lasing in said active region.

19. The quantum cascade laser of claim 18, wherein said reflective element provides frequency selective reflection.

20. The quantum cascade laser of claim 18, wherein said reflective element comprises a reflective grating.

21. The quantum cascade laser of claim 20, further comprising a mechanism for adjusting a grating angle of said reflective grating so as to tune frequency of the lasing radiation generated by said active region.

22. The quantum cascade laser of claim 18, wherein said optical element comprises a lens.

23. The quantum cascade laser of claim 1, wherein said optical element optically coupled to said output facet is adapted to enhance transmission of radiation through said output facet so as to quench lasing within the active region, said quantum cascade laser further comprising:
a frequency selective reflective element optically coupled to said output facet to provide optical feedback to said active region for radiation having one or more frequencies to initiate lasing in said active region for said one or more frequencies.

24. The quantum cascade laser of claim 23, further comprising a mechanism for adjusting said frequency selective reflective element so as to tune the lasing frequency.

25. A quantum cascade laser, comprising:
an active region for generating lasing radiation in a frequency range of about 1 to about 10 Terahertz, said active region having an output facet through which radiation is coupled to an external environment, and
a waveguide formed of an upper metallic layer and a lower metallic layer, each layer being disposed on a surface of said active region so as to confine one or more modes of said lasing radiation within said active region, and
an optical element optically coupled to said output facet and in physical contact therewith so as to enhance coupling of radiation from the active region to the external environment while reducing a maximum operating temperature of the laser at which the lasing radiation is generated by a value less than about 10 degrees Celsius.

26. The quantum cascade laser of claim 25, wherein said optical element causes a reduction in said maximum operating temperature by a value less than about 5 degrees Celsius.

* * * * *